United States Patent [19]

Maruska et al.

[11] Patent Number: 5,436,800
[45] Date of Patent: Jul. 25, 1995

[54] ZERO IMPACT MODULE EJECTION SYSTEM

[75] Inventors: David W. Maruska, Hopkinton; Jeffrey M. Lewis, Maynard, both of Mass.

[73] Assignee: Digital Equipment Corporation, Maynard, Mass.

[21] Appl. No.: 92,624

[22] Filed: Jul. 16, 1993

[51] Int. Cl.⁶ .............................................. H05K 5/00
[52] U.S. Cl. ................................... 361/752; 361/796; 211/41
[58] Field of Search ............... 361/736, 737, 740, 741, 361/752, 753, 754, 796, 797, 798; 211/41; 439/59, 60, 61

[56] References Cited

U.S. PATENT DOCUMENTS

| | | |
|---|---|---|
| 3,582,714 | 6/1971 | Shmurak .............................. 174/15 |
| 4,223,973 | 9/1980 | Tamburro . |
| 4,301,494 | 11/1981 | Jordan ................................. 361/754 |
| 5,148,350 | 9/1992 | Chan et al. .......................... 361/752 |
| 5,162,979 | 11/1992 | Anzelone et al. .................... 361/754 |
| 5,162,980 | 11/1992 | Morgan et al. ...................... 361/752 |

*Primary Examiner*—Bot Ledynh
*Attorney, Agent, or Firm*—Diane C. Drozenski; Denis G. Maloney; Arthur W. Fisher

[57] ABSTRACT

A circuit board is ejected from an electrical chassis by inserting a pair of implements into corresponding pairs of apertures disposed on opposing side members of the electrical chassis. The end portions of the implements are engaged in a first pair of notches, each one being disposed on each of a pair of opposing edges of the circuit board provided within the electrical chassis, and a force is exerted on each of the first notches disposed on each of the pair of opposing edges of the circuit board with the pair of implements, to disengage the circuit board from a connector located at one end of the electrical chassis.

4 Claims, 6 Drawing Sheets

ZERO IMPACT MODULE EJECTION SYSTEM

BACKGROUND OF THE INVENTION

This invention relates generally to printed circuit boards and more specifically to the removal of printed circuit boards from connectors.

As it is known in the art, electronic systems often include devices and circuits which are mounted on printed circuit boards. These boards typically have connectors which can have as few as a couple and up to hundreds of pins in accordance with the complexity of the board. Often, several boards are disposed in a housing. The housing will typically include a backplane connector which corresponds to the connector on the board. One of the pair of connectors has a number of pins while the corresponding connector has holes into which the pins are inserted. As the number of pins in the connector increases, so does the insertion forces necessary to plug the board into the backplane connector located in the housing.

Correspondingly, therefore, a large amount of force is necessary to remove the printed circuit board from the backplane connector. In numerous instances, not only is a significant amount of force necessary, but due to the physical constraints of the enclosure in which the printed circuit board resides, little room is available to insert a hand or some other instrument to remove the printed circuit board.

Ejection methods have included lever-type fixtures which are mounted on the end of a circuit board to exert a force on the board to pry the board away from the backplane connector. These fixtures however, require space within the enclosure as well as occupy space on the printed circuit board thus limiting available space for logic devices and circuitry. In addition, these fixtures add cost to the assembly.

SUMMARY OF THE INVENTION

In accordance with the present invention, an electrical chassis assembly includes, two opposing side members, with at least one aperture, preferably a pair thereof, in at least one, preferably both of the opposing side members and a circuit board disposed within the electrical chassis, where the circuit board has at least one and preferably a pair of notches disposed on at least one and preferably both opposing edges of the circuit board, and aligned with the pair of apertures in the opposing side members. With such an arrangement the circuit board may be removed from the assembly by using the apertures and notches without adding additional the cost to the assembly associated with prior methods of providing ejection means for circuit boards located within enclosures.

In accordance with a further aspect of the present invention, a method for ejecting a circuit board from an electrical chassis includes the steps of inserting a pair of implements into corresponding pairs of apertures disposed on opposing side members of the electrical chassis, engaging the end portions of the implements in a first notch disposed on each of a pair of opposing edges of a circuit board provided within the electrical chassis, and exerting a force on each of the first notches disposed on each of the pair of opposing edges of the circuit board with the pair of implements to disengage the circuit board from a connector located at one end of the electrical chassis. With such an arrangement a printed circuit board is removed from a connector within an enclosure with minimal cost. Space on the printed circuit board is retained for logic devices and circuitry rather than a cumbersome ejection apparatus. In addition, space within the enclosure is conserved by using the described method because a typical ejection apparatus would utilize space within the enclosure as well.

BRIEF DESCRIPTION OF THE DRAWINGS

The above-mentioned and other features of the invention will now become more apparent by reference to the following description taken in connection with the accompanying drawings in which.

DESCRIPTION OF THE PREFERRED EMBODIMENTS

Figure 1:
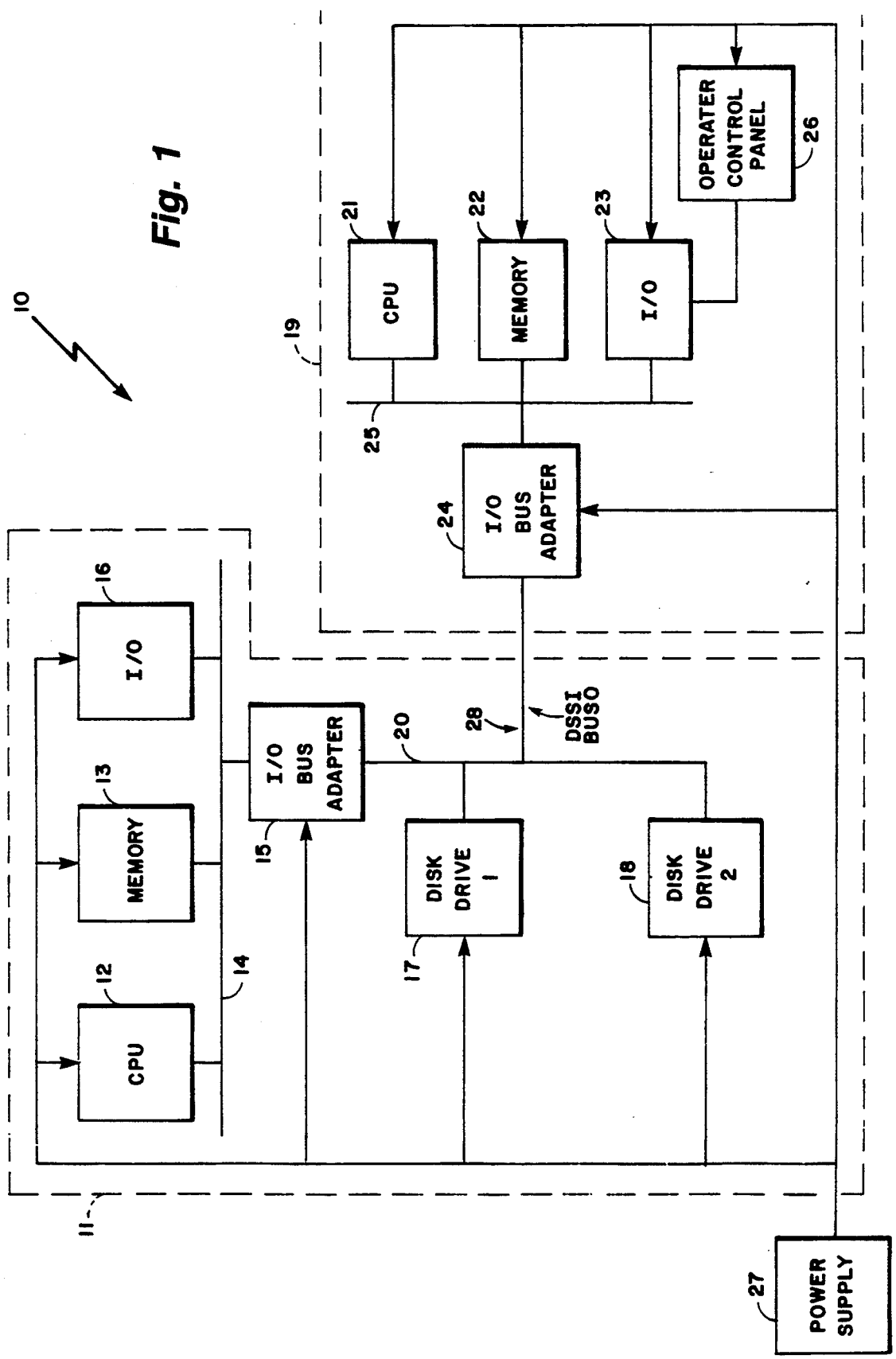
FIG. 1 is a block diagram of a general purpose, clustered computer system.

Referring now to FIG. 1, a general purpose, clustered computer system 10 is shown to include a general purpose computer 11 having inter alia a Central Processing Unit (CPU) 12, a system memory 13, I/O 16 and an I/O bus adapter 15 all interconnected via a system bus 14. CPU 12 typically includes a microprocessor device, interface circuits and timing and control circuits and is used to process computer instructions, generally fetched from system memory 13, in a predetermined manner to complete some computer processing task. System memory 13 typically includes a plurality of integrated circuit memory devices such as dynamic random access memory (DRAM) or static random access memory (SRAM) which provide main data storage for the CPU. The I/O bus adapter 15 is further coupled to two disk drives 17 and 18 through an I/O bus 20.

The general purpose, clustered computer system further includes a second general purpose computer 19 including a CPU 21, a system memory 22, I/O 23 and an I/O bus adapter 24 each communicating through a system bus 25. In general the second general purpose computer system 19 provides similar functionality as general purpose computer system 11. Further included in the second general purpose computer 19 is an operator control panel 26 which provides an operator control over the second general purpose computer 19. The clustered general purpose computer is also shown to include a single power supply 27, which provides all appropriate voltages such as five volts for the logic devices and twelve volts for the electro-mechanical devices in the disk drive. That is the power supply here supplying power to each module of the first general purpose computer as well as to each of the disk drives and each module of the second general purpose computer 19. General purpose computer 11 and general purpose computer 19 are logically connected through a Digital Storage System Interconnect (DSSI) Bus 28 here referred to as DSSI bus_0.

Figure 2:
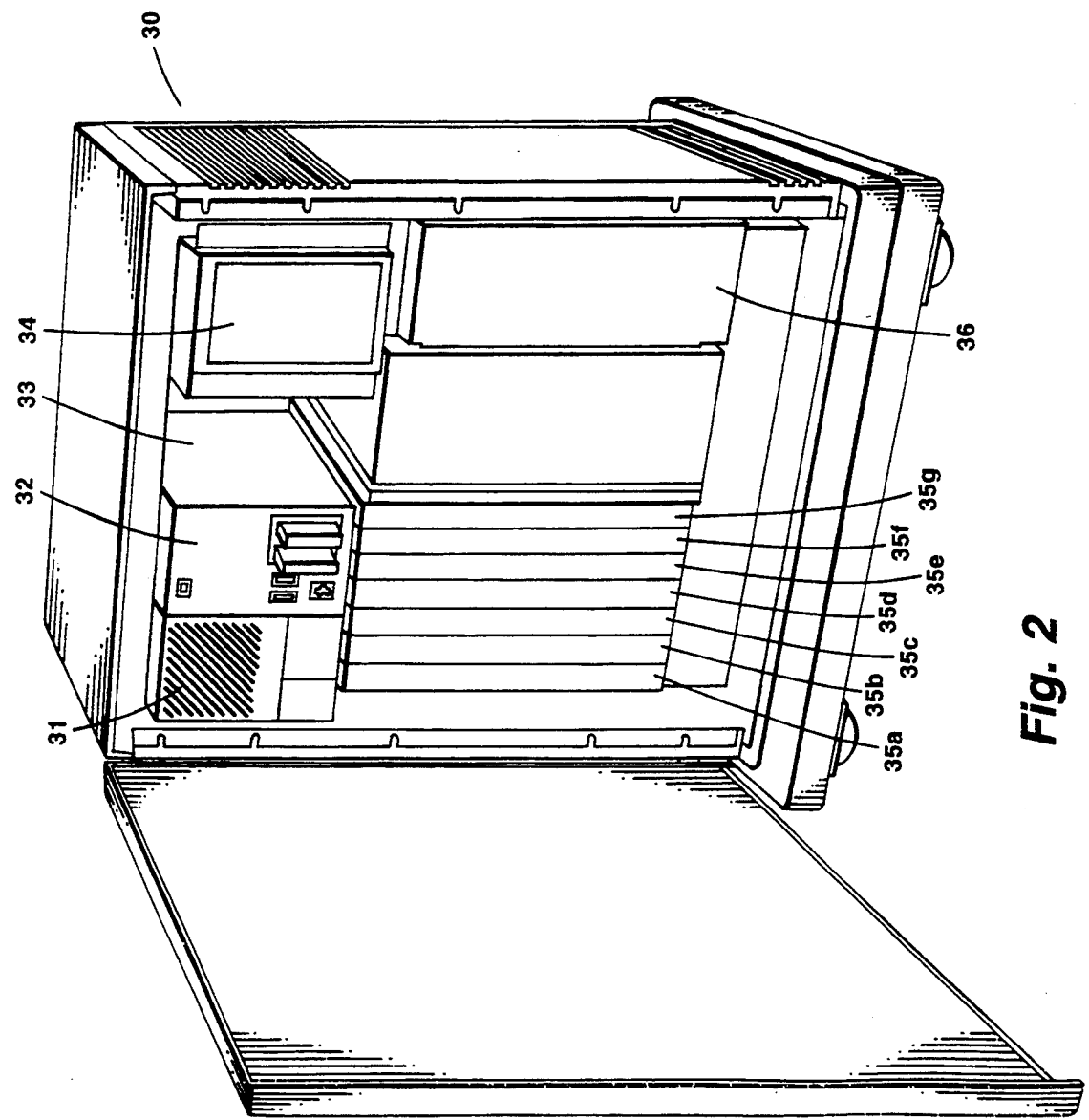
FIG. 2 is an isometric view of a computer system cabinet housing the general purpose, clustered computer system of FIG. 1.

Referring now to FIG. 2, a system cabinet 30 to house the general purpose, clustered computer system of FIG. 1 is shown. The first general purpose computer system 11 and power supply 27 are housed within the lower portion of the cabinet here depicted by modules 35a–35g. The power supply 27 is depicted here as being located in the right hand portion 36, as shown. The cabinet 30 further has openings to accommodate here, three disk drives. Housed in one of the disk drive openings is the second general purpose computer 19 including the CPU module, the memory module, the system bus, and the I/O adapter interface as discussed above appropriately packaged 32. Here, shown housed in one of the remaining disk drive openings, is a disk drive 31. The third disk drive slot 33 is shown empty. Also shown included in the system cabinet 30 is a tape drive 34. The packaged 32, second general purpose computer system 19 of FIG. 1, is located within the disk drive opening and is physically and logically connected through the standard disk drive connections, including power and an I/O bus capable of supporting CPU to CPU communication protocol. Examples of bus protocols include a system bus protocol, a network protocol and an I/O bus protocol. Preferably, the bus protocol is the Digital Storage System Interconnect (DSSI).

A DSSI bus is a general purpose communication bus. The DSSI bus is used to connect host computers and storage devices. It is similar in function to a Computer Interconnect (CI) bus protocol which is used for interconnecting medium to large computer systems into clusters. The DSSI bus, like the CI bus, operates using the System Communication Architecture protocols. The DSSI bus is the preferable bus because it operates at a high level thus handling error conditions more effectively. Because the electrical specifications for a DSSI bus cluster are very stringent regarding the lengths of the electrical paths, the maximum number of nodes on a DSSI bus cluster is three when a typical configuration using separate cabinets for each system is used. By connecting additional general purpose computer systems through the DSSI ports in the disk drive slots, shorter electrical paths result, thus allowing the maximum number of general purpose computer systems which may be connected through this process to increase up to eight. Through these connections and some additional clustering software, the general purpose computer system apparatus is connected in a cluster configuration with the general purpose computer housed within the main cabinet.

Figure 3:
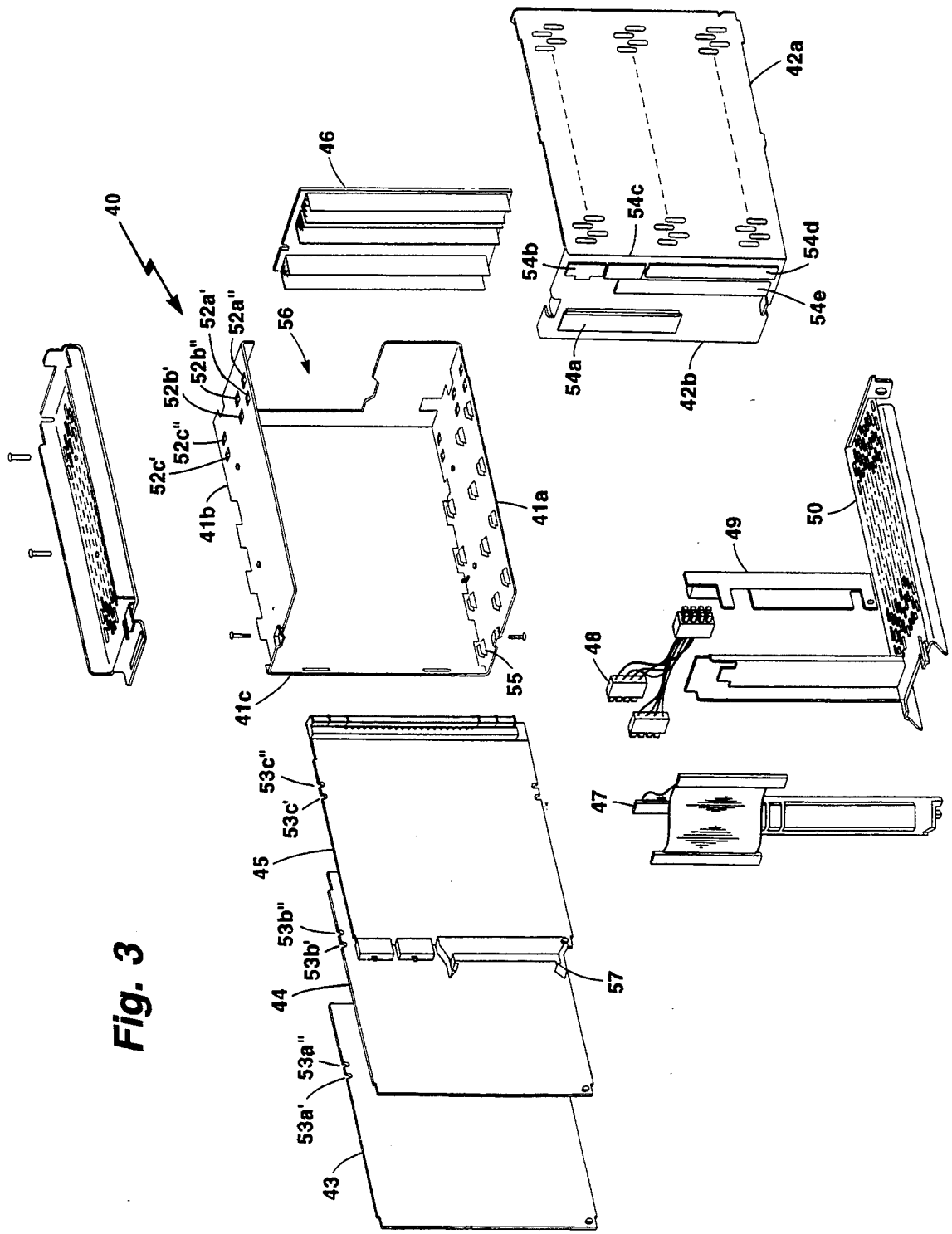
FIG. 3 is an exploded view of a general purpose computer brick.

Referring now to FIG. 3, the second general purpose computer system 19 is packaged in a configuration adapted to be mounted in a standard 5¼ inch disk drive opening. The enclosure for the second general purpose computer 19 is shown to include a vented side panel 42a which allows air flow through the apparatus. A portion of the panel 42b is bent at an angle orthogonal to the air vented portion of the panel and includes five apertures 54a–54e through which the second general purpose computer system 19 receives connections from the general purpose computer system 11 for DSSI bus_0, a Small Computer System Interconnect (SCSI) bus and a Q bus. Through two of the apertures 54b, 54c the second general purpose computer system also receives power from the power supply 27. The opposing side of the general purpose computer apparatus is shown as a solid metal chassis having a pair of side panels 41a, 41b bent at an angle such that the panels 41a, 41b are mutually parallel and orthogonal to the base member 41c. The side panels 41a, 41b have guides 55 which will position here three printed circuit boards 43, 44, 45 disposed within the metal enclosure. Also located on these two side panels 41a, 41b are three pairs of rectangular apertures 52a', 52a", 52b', 52b", 52c', 52c".

At a first end of the general purpose computer apparatus 40 is an area 56 through which access is available to a locking connector disposed within the metal enclosure of the general purpose computer apparatus 40. This locking connector accepts a ribbon cable input located on the back of the control panel 26. Secured to two of the sides of the metal enclosure is additional air vented bracketing 50, 51 which allows the packaged general purpose computer 32 to be inserted into a disk drive opening in a system cabinet 30 as shown in FIG. 2. Further included at one end of the metal enclosure are connectors 46 which the printed circuit boards are plugged into. Additional connectors are found at the opposite end of the CPU module 57, a mate and lock connector 48 to connect to the power supply 27 and a ribbon cable connector 47 with locking tabs to connect to the DSSI bus$_{13}$ 0 28 and the SCSI bus of general purpose computer system 11. The opposing end of each of these connectors plugs into a paddle card 49 which physically connects to the backplane within the disk drive slot and logically connects to the SCSI bus and the DSSI bus_0 28 of general purpose computer system 11. Shown is a typical configuration including two DSSI buses, a SCSI bus, a Q bus which is a general purpose I/O bus and a NI bus or ETHERNET bus which is a network bus as will be mentioned. Other configurations of course could be used, provided a bus is made available to interconnect the first general purpose computer to the second general purpose computer.

Figure 4:
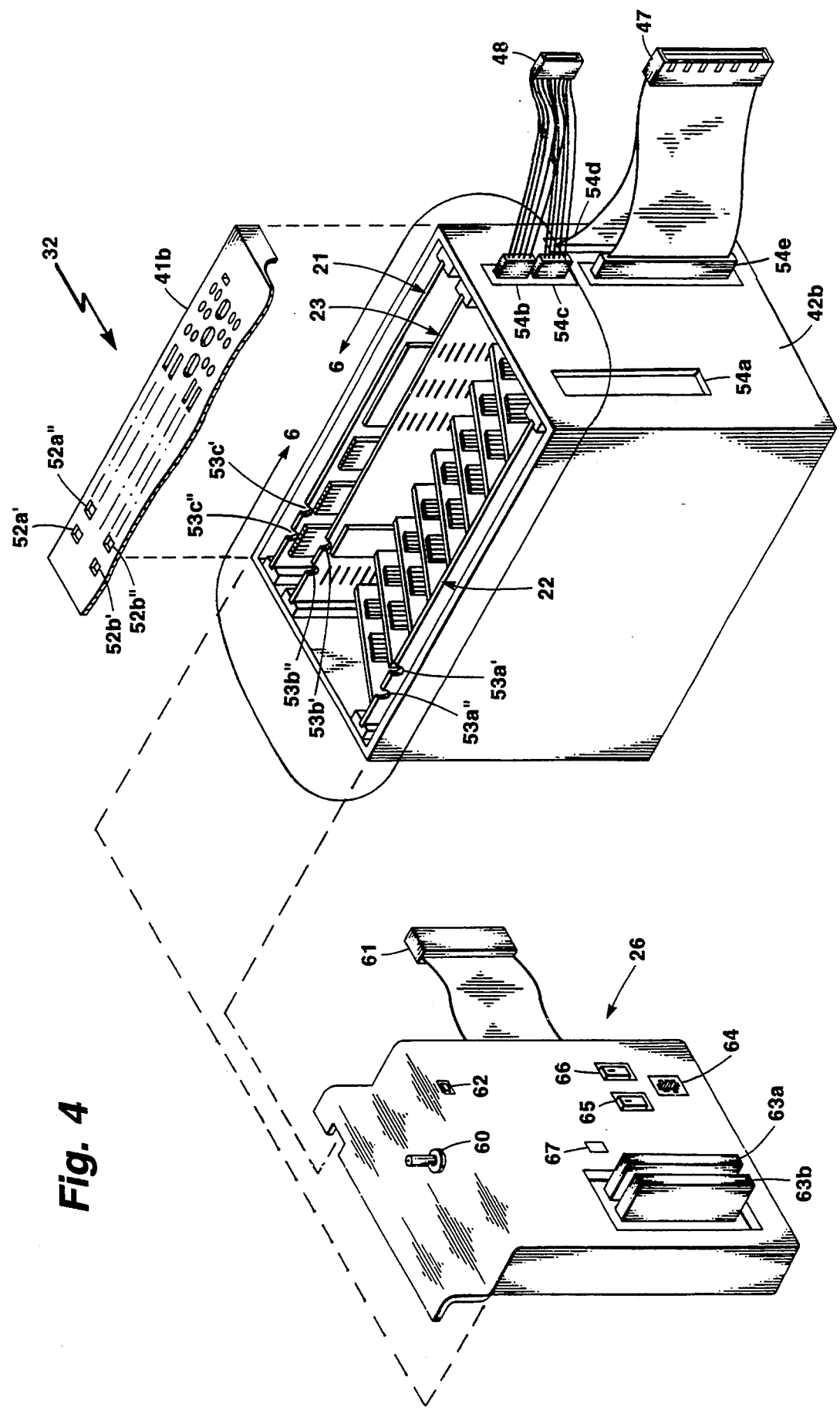
FIG. 4 is an isometric cutaway view of the general purpose computer brick of FIG. 3 showing inner components of the brick.

Referring now to FIG. 4 the assembled general purpose computer 19 packaged as a computer "brick" 32 is shown to include a CPU module 21, an I/O module 23 and eight single inline memory modules plugged at an angle into a memory carrier 22. The CPU module 21 is partitioned to contain the logic for the CPU, the DSSI bus_0 28 and the network interconnect. The I/O module 23 is partitioned to include the logic for I/O operations, DSSI bus_1 and Q bus. The CPU module 21, the I/O module 23 and the memory carrier 22 are each provided with notches 53a', 53a'", 53b'. 53b'", 53c', 53c" on the edges of the printed circuit board to be used in removing the individual boards from the enclosure as will be described.

Cabling to connect the general purpose computer brick to the existing general purpose computer system housed within the existing cabinet is fed through five apertures 54a–54e at one end of the general purpose computer brick's enclosure. Connections are made to power, DSSI bus_0 28, SCSI and Q bus through these five apertures 54a–54e. On the opposite end of the brick from these apertures, the operator control panel 26 is connected using a high density ribbon cable 61 into a connector on the general purpose computer brick which includes locking tabs. The operator control panel 26 includes a network interconnect BNC connector 60 here for an NI or ETHERNET bus and a console port. Also included are a reset button (reboot) 66, a halt button 65 and a halt enable switch 62. Two high density dual in-line (DIN) connectors 65, 66 are also included through which peripherals may be connected to the general purpose computer brick's 32 DSSI bus_1. The operator control panel also includes a diagnostic display 67 to display any errors the general purpose computer brick 32 might encounter.

Figure 5:
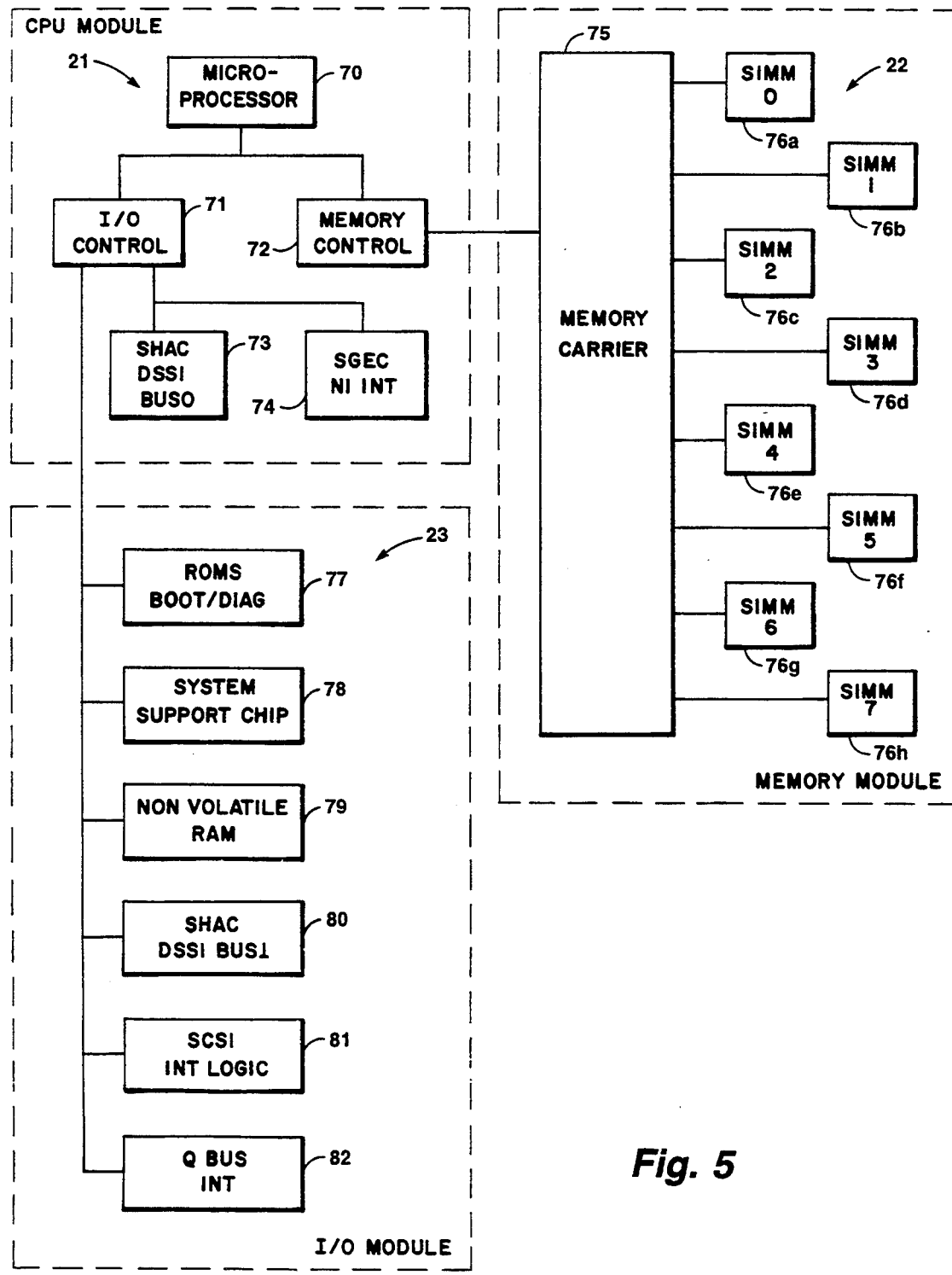
FIG. 5 is a block diagram representing the partitioning of the modules of the general purpose computer brick.

Referring now to FIG. 5, the partitioning of the CPU 21, the I/O 23 and the memory modules 22 of FIG. 4 are shown to include the system microprocessor 70, I/O 71 and memory control 72 and a Single Host Adapter Chip (SHAC) for the DSSI bus_0 interface 73 and a Second Generation Ethernet Chip (SGEC) Network Interconnect interface 74 in the CPU module 21. The memory control 72 on the CPU module 21 is connected into the memory module 22 which includes the memory carrier 75 and the single inline memory modules 76a–76h which provide the main system memory. The I/O control 71 of the CPU module 21 is connected into the I/O module 23 which is partitioned to include the read only memory for the bootstrap and diagnostics code 77. Further included in the partitioning of the I/O module 23 is the system support chip 78 and the non-volatile Random Access Memory 79. Interface logic is also included for an SCSI Bus 81, a Q bus 82 and a SHAC for DSSI Bus 1 80 on the I/O module 23.

Figure 6:
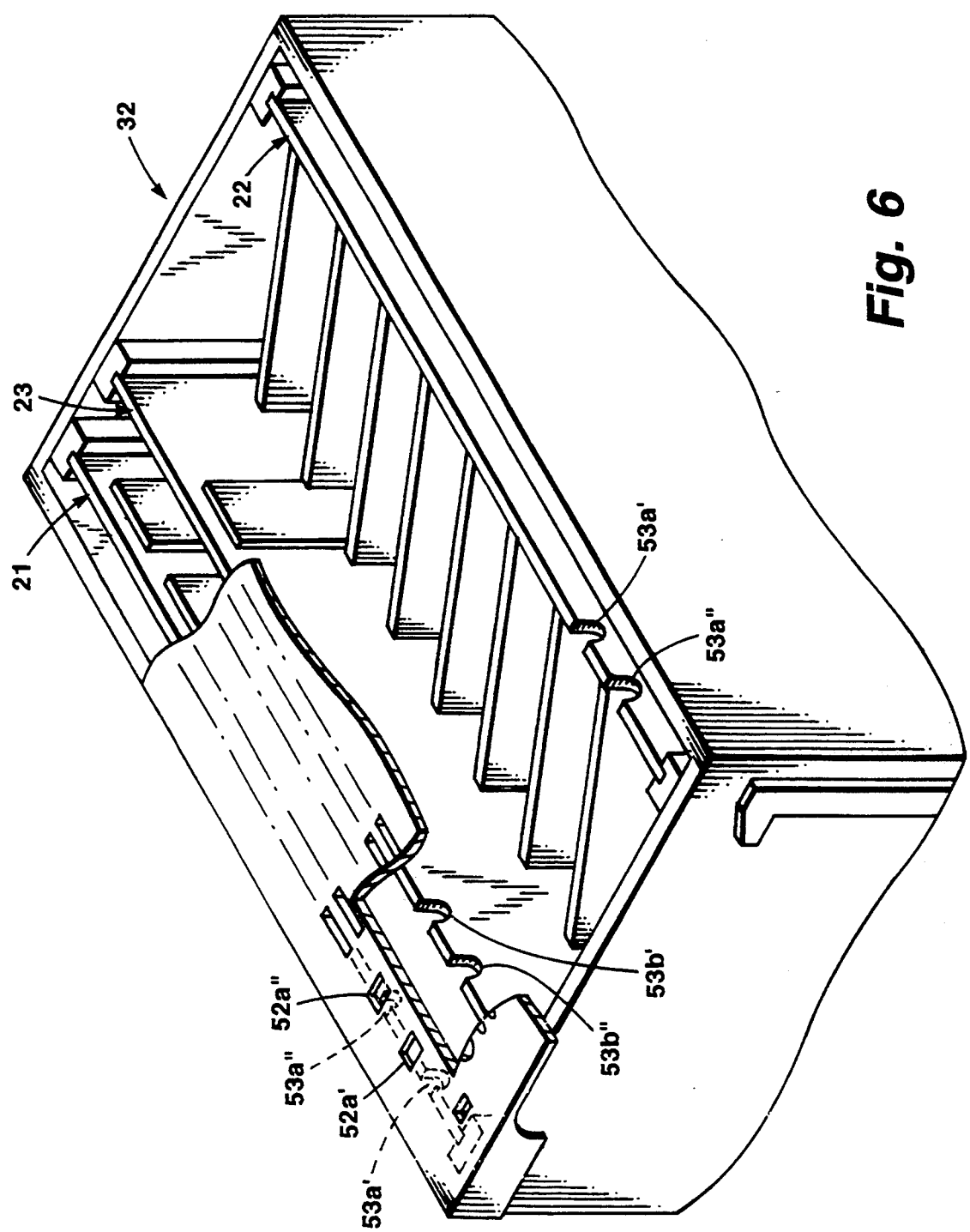
FIG. 6 is an isometric view of the general purpose computer brick depicting a relationship between the apertures in the enclosure of the brick and notches in printed circuit boards disposed in the enclosure.

Referring now to FIG. 6, the brick is shown to include pairs of rectangular apertures 52a', 52a" in proximity to pairs of notches 53b', 53b" on edges of the printed circuit boards 21, 22, 23. When the printed circuit boards 21, 22, 23 are in place within the enclosure of the general purpose computer brick 32 the pair of notches 53a', 53a" on opposing edges of the circuit boards are aligned with apertures 52a', 52a" within the sides of the brick 32. Here the apertures 52a', 52a" are rectangular but of course other shaped apertures could be used. Two flat-headed screwdrivers (not shown) are inserted through the rectangular shaped apertures 52a', 52a" into one of the pair of corresponding notches 53a', 53a" in the circuit board 21 and pressure is placed against the side of the notch to pry or pop the circuit board from its connector. Because of the distance the circuit board must travel in order to be completely freed from the connector, it is preferred to have two rectangular apertures as well as two notches provided in order that the necessary travel may be achieved. The notches are placed in the circuit boards such that when the circuit board is in place within the enclosure half of one of the notches is visible through the rectangular aperture and the second notch is hidden behind the space between the two apertures.

The ejection technique has been particularly described with the use of a pair of notches and associated apertures in each circuit board edge and side wall portion of the chassis. It should be understood however, that a single notch in each edge and an associated aperture in each side wall can be used. Further, a single notch or pair of notches on one side of the circuit board can also be used.

Having described preferred embodiments of the invention, it will now become apparent to those of skill in the art that other embodiments incorporating its concepts may be provided. It is felt therefore that this invention should not be limited to the disclosed embodiments but rather should be limited only by the spirit and scope of the appended claims.

What is claimed is:

1. An electrical chassis assembly comprising:
   a side member having a pair of apertures; and
   a circuit board disposed within said electrical chassis assembly with major surfaces of said circuit board disposed perpendicular to major surfaces of said side member, said circuit board having a pair of notches disposed on an edge of said circuit board, with each notch being aligned with a corresponding one of said apertures in said side member;
   wherein the notches and apertures are aligned such that a first notch of said pair of notches is positioned such that a portion of said first notch is directly accessible through a first aperture of said pair of apertures and a second notch of said pair of notches is positioned between said pair of apertures.

2. The electrical chassis assembly of claim 1 further comprising:
   a second side member having a pair of apertures and wherein said circuit board has a second pair of notches disposed in a second, opposing edge of said circuit board and aligned with said pair of apertures of said second side member.

3. The electrical chassis assembly of claim 2 wherein said second pair of notches and said pair of apertures of said second side member are aligned such that a first notch of said second pair of notches is positioned such that a portion of said first notch is directly accessible through a first aperture of said pair of apertures of said second side member and a second notch of said second pair of notches is positioned between said pair of apertures of said second side member.

4. The electrical chassis assembly of claim 2 wherein each of said pair of apertures is rectangular in shape.

* * * * *